United States Patent
Vareljian et al.

(10) Patent No.: US 10,291,271 B1
(45) Date of Patent: May 14, 2019

(54) ADAPTIVE ANALOG PARALLEL COMBINER

(71) Applicants: Albert Vareljian, Folsom, CA (US); Vassili Kireev, San Jose, CA (US)

(72) Inventors: Albert Vareljian, Folsom, CA (US); Vassili Kireev, San Jose, CA (US)

(*) Notice: Subject to any disclaimer, the term of this patent is extended or adjusted under 35 U.S.C. 154(b) by 0 days.

(21) Appl. No.: 15/845,975

(22) Filed: Dec. 18, 2017

Related U.S. Application Data

(63) Continuation of application No. 15/345,239, filed on Nov. 7, 2016, now Pat. No. 9,853,666.

(60) Provisional application No. 62/294,752, filed on Feb. 12, 2016.

(51) Int. Cl.
*H04L 27/08* (2006.01)
*H04B 1/10* (2006.01)
*H03G 3/20* (2006.01)
*H04B 1/16* (2006.01)

(52) U.S. Cl.
CPC ............ *H04B 1/1027* (2013.01); *H03G 3/20* (2013.01); *H04B 1/16* (2013.01)

(58) Field of Classification Search
CPC ........... H04B 1/1027; H04B 1/16; H03G 3/20
USPC ......................................................... 375/345
See application file for complete search history.

(56) References Cited

U.S. PATENT DOCUMENTS

| | | | | |
|---|---|---|---|---|
| 5,652,770 A * | 7/1997 | Eatwell | .............. | H03H 17/0283 375/350 |
| 5,790,600 A * | 8/1998 | Marchesani | ...... | H04L 25/03114 329/304 |
| 6,710,644 B2 * | 3/2004 | Duncan | .................. | H03D 3/008 327/55 |
| 8,120,426 B1 * | 2/2012 | Granger-Jones | ...... | H03F 1/0277 330/253 |
| 8,121,236 B1 * | 2/2012 | Furman | ............. | H04L 25/03038 327/551 |
| 2008/0013657 A1 * | 1/2008 | Aouine | .............. | H03H 17/0294 375/350 |
| 2008/0158034 A1 * | 7/2008 | Clark | ............... | H04B 10/25133 341/155 |

* cited by examiner

*Primary Examiner* — Helene E Tayong
(74) *Attorney, Agent, or Firm* — Womble Bond Dickinson (US) LLP

(57) ABSTRACT

An adaptive analog parallel combiner circuit for receiver data recovery from a communication signal is provided. The circuit includes a summer that sums outputs of a plurality of filter taps in parallel, including zeroth and first through Nth filter taps, each filter tap having as input the communication signal or a version thereof, wherein N is a finite integer greater than or equal to two. The zeroth filter tap has an amplifier with gain controlled by a zeroth adaptive gain control coefficient, and each of the first through Nth filter taps having an all pass filter and gain controlled amplification, with gain controlled by a corresponding one of a first through Nth adaptive gain control coefficients and the all pass filter implementing a transfer function having a zero and a pole equaling each other and at a base frequency divided by a corresponding integer from one through N.

20 Claims, 5 Drawing Sheets

Example Adaptive Analog Parallel Combiner

- Alternative to the Cascade Parallel filter structure – Adaptive Analog Parallel Combiner
- Parallel structure utilizes different Cell TF individually for each taps

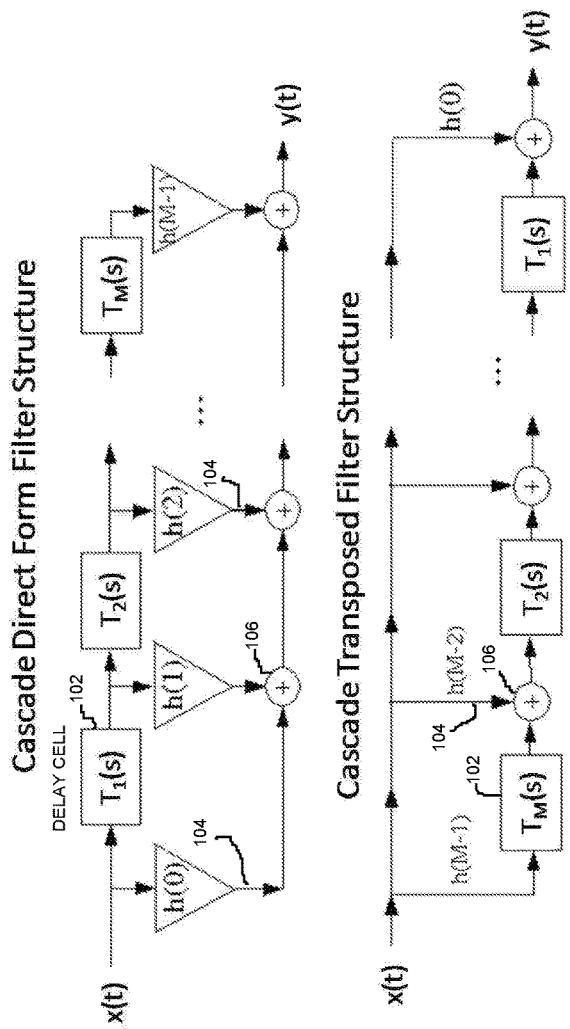
Fig. 1. Conventional Cascaded Filter Structures

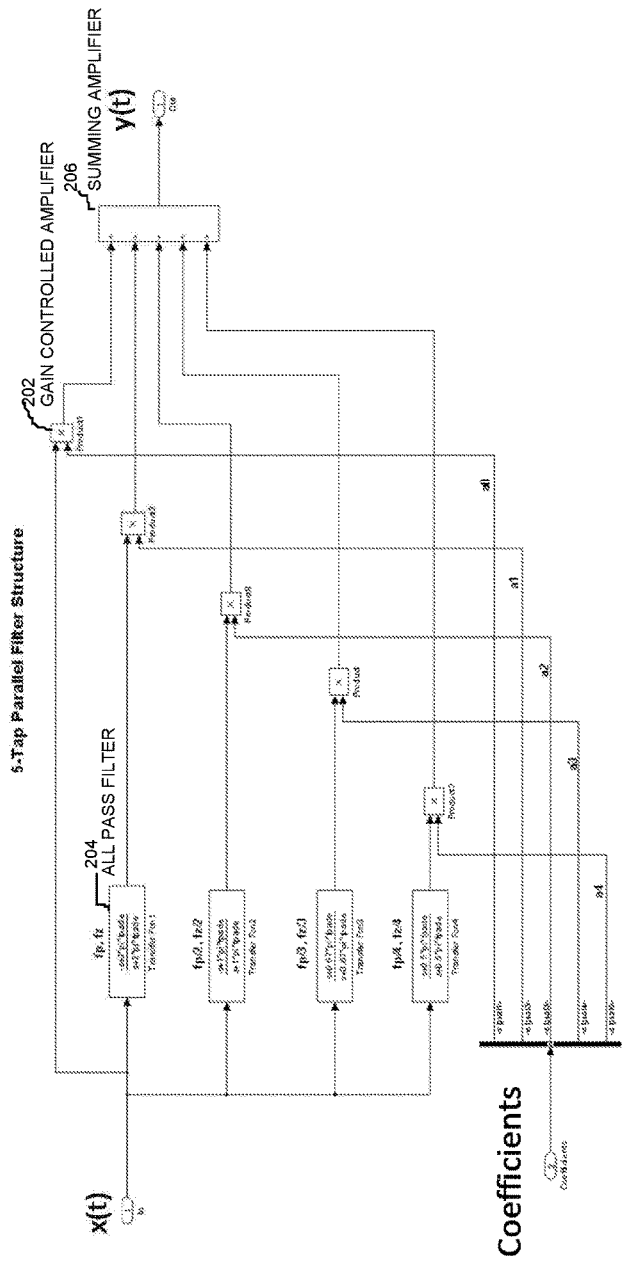
Fig. 2. Example Adaptive Analog Parallel Combiner
- Alternative to the Cascade Parallel filter structure – Adaptive Analog Parallel Combiner
- Parallel structure utilizes different Cell TF individually for each taps

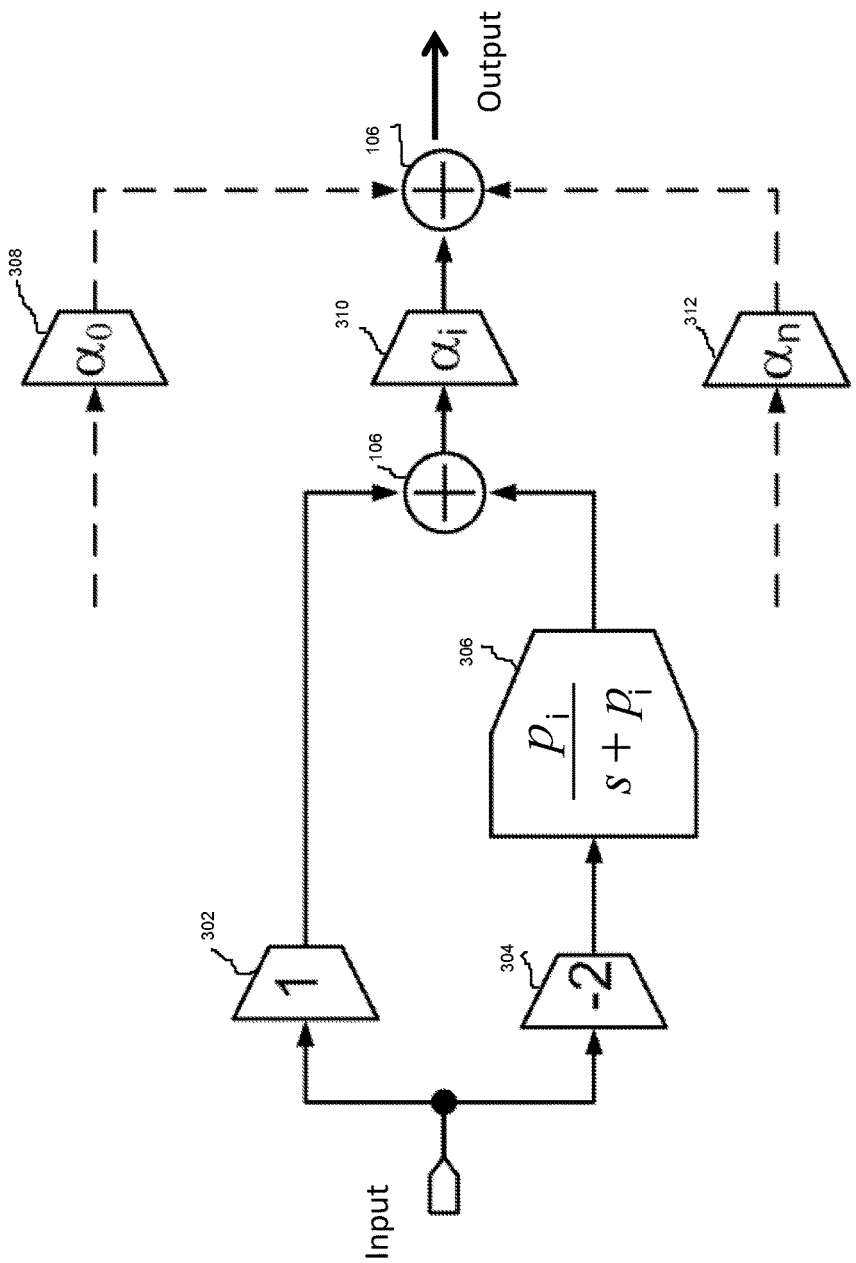
Fig. 3. Parallel Filter cells summing arrangement

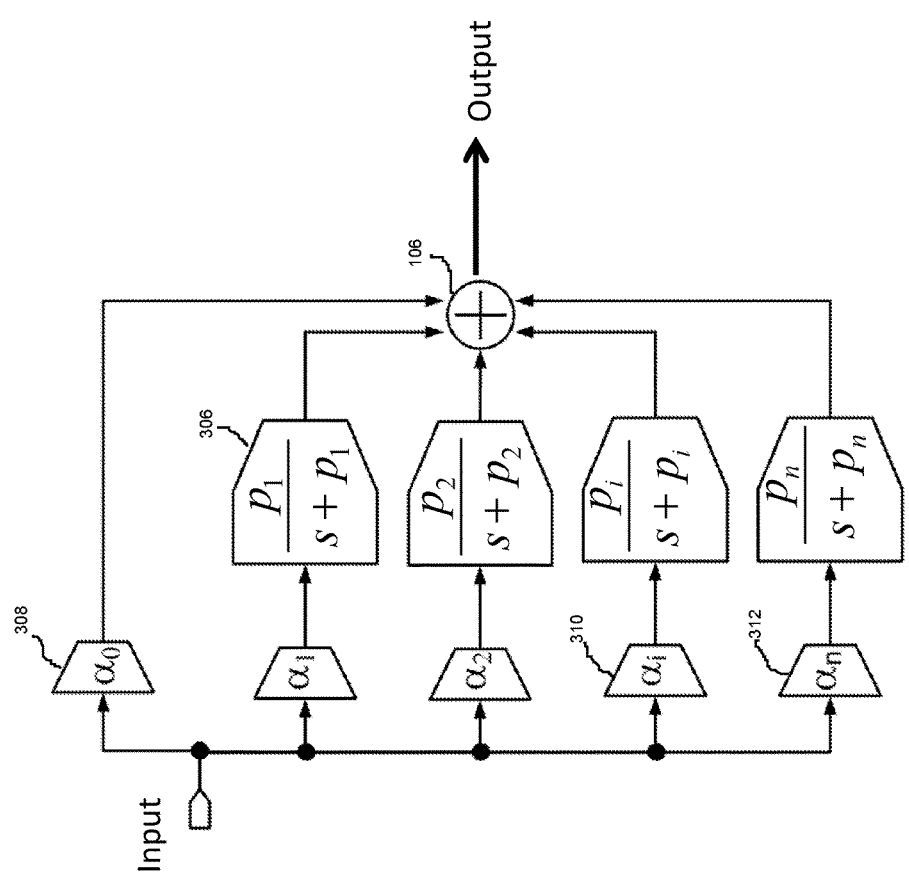
Fig. 4. Parallel Filter Structure

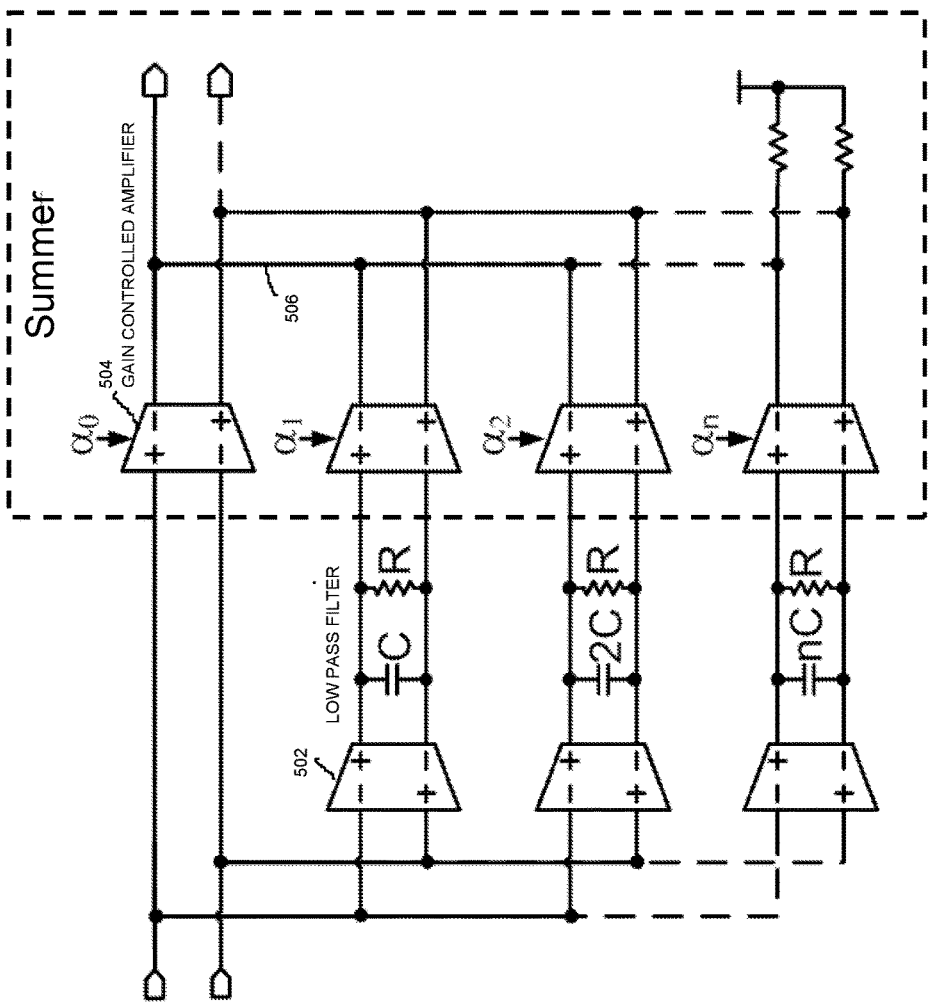
Fig. 5. Example Parallel Filter Gm Implementation

ADAPTIVE ANALOG PARALLEL COMBINER

BACKGROUND

With continued demand for higher bandwidth in wireline, optical and wireless data communications systems, the output signaling rates in transceivers under development presently approach 25 Gb/s range and beyond. At multi-GHz speeds the main channel impairments such as insertion loss and inter-channel crosstalk interference are dramatically increased, presenting considerable challenge for the receiver data recovery and demanding application of advanced adaptive signal processing algorithms to achieve near-optimal reception. While such adaptive processing methods and algorithms are well described in the literature and readily implementable in the digital domain—commonly referred to as digital signal processing (DSP), their respective implementation at multi-GHz data speeds proves impractical due to excessive processor power consumption, or may even be impossible due to the absence of suitable high-speed analog-to-digital converters (ADCs) with sufficient resolution. Therefore, the majority of prior art approaches, addressing multi-Gb/s signaling, relies on analog circuits and methods—which, while potentially achieving very high-speeds, however, in nature are of relatively low performance and/or not sufficiently adaptive to cover wide range channel characteristic variations and achieve close to optimal reception. This limits the prior art effective applications to a low-index modulation schemes such as PAM2 and relatively short-reach channels with low to moderate dispersion, loss and crosstalk impairments.

Recently, a fully adaptive analog Padé filter and transceiver was introduced to overcome the above mentioned limitations. While successful in addressing many above mentioned issues, the Padé adaptive filter was not free from the deficiencies of its own. One such deficiency lays specifically in the filter cascade-based structure. When the number of cascade stages grows, particularly greater than three, which is typically required under lossy channel conditions, the parasitic effects of each stage cause overall filter transfer function (TF) degradation in exponential manner, severely limiting the maximum achievable receiver bandwidth. Other adverse effects include considerable increase in the filter coefficient values, higher output noise and the loss of signal linear dynamic range. In addition, the stage DC offset combination effects in the chain could result in significant level shifts, causing considerable signal distortions at the intermediate nodes and at the output. Some of these adverse effects could be potentially minimized, however, at the cost of substantial increase in power that depreciates most advantages of analog signal processing. Hence, it would be highly beneficial to find an alternative structure, while free from the mentioned limitations of a cascade, still capable of achieving the desirable overall analog adaptive filter properties with respect to the overall goal transfer characteristics. It is within this context that the embodiments arise.

SUMMARY

An adaptive analog parallel combiner circuit for receiver data recovery from a communication signal is provided. The circuit includes a summer that sums outputs of a plurality of filter taps in parallel, including zeroth and first through Nth filter taps, each filter tap having as input the communication signal or a version thereof, wherein N is a finite integer greater than or equal to two. The zeroth filter tap has an amplifier with gain controlled by a zeroth adaptive gain control coefficient, and each of the first through Nth filter taps having an all pass filter and gain controlled amplification, with gain controlled by a corresponding one of a first through Nth adaptive gain control coefficients and the all pass filter implementing a transfer function having a zero and a pole equaling each other and at a base frequency divided by a corresponding integer from one through N.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIG. 1 is a block diagram of conventional Direct and Transposed Structure Forms of Analog Filters.

FIG. 2 is an example block diagram of the proposed Adaptive Analog Parallel Combiner.

FIG. 3 is an example structure of the Cell for the Adaptive Analog Parallel Combiner.

FIG. 4 is another example structure of the Adaptive Analog Parallel Combiner based on the Cells of FIG. 3.

FIG. 5 is an example implementation of the Adaptive Analog Parallel Combiner based on Gm Cells.

DETAILED DESCRIPTION

Conventional cascade feed-forward and transposed filter structures used in Padé adaptive filter are shown in FIG. 1. The direct (feed-forward) and transposed implementations are equivalent in terms of the overall transfer function for a given set of the coefficients, which could be generated by an adaptation loop responsive to the minimum slicer error criteria when operating over a given lossy channel. In both structures to obtain a certain tap response the signal should pass thru a number of cascaded stages corresponding to the tap index and, hence, would experience bandwidth and linearity degradations as well as additional noise and offset, pertaining to each stage. While some of transfer function degradations are additive in nature such as noise and offset, the other, namely, bandwidth degradation and non-linear distortions are multiplicative in each stage, i.e. in the chain of identical unit-time delay cells 102 they can grow exponentially, causing severe filter performance degradations. Distortions are also additive through the series of summers 106, each of which sums gain multiplied results 104, with cascaded cells, in series. Another potential realization issue in the cascaded structures is the need to control analog gain of each stage close to 0 dB, with is difficult over the process corner, voltage and temperature (PVT) variations, keeping at the same time the functionality of each cell.

To overcome the above mentioned detrimental effects, while still preserving the desirable adaptive filter properties, the parallel filter structure according to this disclosure, referred to as Adaptive Analog Parallel Combiner (AAPC), is shown in FIG. 2. Unlike the cascade filter structure of FIG. 1 the TF (transfer function) for each filter tap is formed individually. Each individual cell can be implemented as a cascade of sub-cells with desired characteristics, as a dedicated single cell, or a combination of thereof. If each of the cells is implemented as a custom cell with an all pass filter 204, the total number of phase shift cells becomes the same as those for the series filter of FIG. 1, while each tap in this case (except for one) has just one phase shift cell between the communication signal input and the summing node, e.g., summing amplifier 206, and hence performance degradation for the parallel filter with custom cells is minimized.

The AAPC may use in its cells a TF of the Padé general form, which in the first-order case, discussed herein for simplicity, has a Laplace expression of $(s-z)/(s+p)$, where z and p are a zero and pole respectively and s is the complex frequency. This first order TF belongs to the so called all-pass type, having theoretically a frequency-independent flat magnitude response when $z=p$ and a phase shift of $\pi/2$ at the frequency of interest. This function type can be realized by a variety of active and passive networks such as an RC-bridge, for example, with or without feedback and other circuit configurations in combination with summation blocks. Implementations of the filters, multipliers and summers in various embodiments described herein can use various types of amplifiers, such as voltage amplifiers, current amplifiers, voltage to current amplifiers, current to voltage amplifiers, transconductance amplifiers, current differencing transconductance amplifiers, differential amplifiers, fully differential amplifiers (i.e., differential input, differential output amplifiers), etc.

Continuing with reference to the embodiment shown in FIG. 2, versions of the analog circuit for an adaptive parallel combiner are described as follows. A summer, which could be a summing node, summing amplifier 206, transimpedance amplifier, or multiple summers (e.g., summer 106 of FIG. 1), sums outputs of filter taps that are implemented in parallel. There are filter taps from zero through N, where N is a finite integer greater than or equal to two. Each filter tap has the communication signal of interest, or a derivative thereof (e.g., amplified, or converted from voltage to current or current to voltage), as the input. The zeroth filter tap has a gain controlled amplifier 206 with gain controlled by a zeroth adaptive gain control coefficient, identified in this example as a0. The zeroth filter tap is the only tap that lacks an all pass filter 204.

Each of the first through nth filter taps has an all pass filter 204 and gain controlled amplification, for example using a gain controlled amplifier 206. In some embodiments, the gain controlled amplifier 206 precedes the all pass filter 204, in each tap, and in others the gain controlled amplifier 206 follows or is after the all pass filter 204. Gain of each gain controlled amplifier 206 is controlled by a corresponding first through nth adaptive gain control coefficient. Each all pass filter 204 implements a transfer function that has a zero and a pole equaling each other and equaling two times pi times a base frequency divided by a corresponding integer from one through N. In other words, for the transfer function in the ith tap all pass filter 204, the zero equals the pole, and both of these are at the base frequency divided by the integer i. For example, the first tap (e.g., i=1) has an all pass filter 204 with a pole frequency and a zero frequency, both equal to the base frequency. The all pass filter 204 in the first tap is followed by a gain controlled amplifier 206 with gain controlled by the first coefficient, identified as a1. The second tap (e.g., i=2) has an all pass filter 204 with a pole frequency and a zero frequency, both equal to one half the base frequency (i.e., the base frequency divided by two). The all pass filter 204 in the second tap is followed by a gain controlled amplifier 206 with gain controlled by the second coefficient, identified as a2. The third tap has an all pass filter 204 with a pole frequency and a zero frequency, both equal to one third the base frequency (i.e., the base frequency divided by three). A gain controlled amplifier 206 with gain controlled by the third coefficient, identified as a3, follows the all pass filter 204 in the third tap. The fourth tap has an all pass filter 204 with a pole frequency and a zero frequency, both equal to one fourth the base frequency (i.e., the base frequency divided by four). A gain controlled amplifier 206 with gain controlled by the fourth coefficient, identified as a4, follows the all pass filter 204 in the fourth tap. The circuit is generalized for n taps. Adaptive coefficients from a zeroth coefficient through an nth coefficient in this and further embodiments are sent to the gain controlled amplifiers 206 from a coefficient generator, which could be or include an analog circuit, a digital circuit, a lookup table, software executing on a processor or other circuit readily devised in keeping with the teachings herein. Adaptive coefficients could be sent in analog form as voltages or currents, or in digital form, e.g. as multiple bits.

It should be noted that in some special cases the all pass type forming transfer function zero could be combined for a group of cells into a common feed-through path.

One active realization of the All Pass Phase Shifter (APPS) is based on the signal path filter and combine configuration as shown in FIG. 3. This analog circuit realization aims to perform the following signal operation: $[1-2*p/(s+p)]$, whereby the unity transfer branch is referred to as the feed-through (FT) path. Apparent from the figure, the output signal is formed as a sum of the FT path and the inverted gain of 2, low-pass (LP) filter path, leading to the desired result: $(s-p)/(s+p)$. The Padé cells having their respective pole-zero locations (each representing a given Adaptive Filter tap) are configured to have the output signals summed at a common summing node as shown on FIGS. 3 and 4. In the embodiment shown in FIG. 4, the corresponding FT paths in all of the parallel taps all get combined in one (i.e., the zeroth tap with the gain controlled amplifier 308), whose gain is adjusted by the adaptation process in accordance with the values of the remaining tap coefficients. Setting the gain, e.g., gm, of output stages is used for adaptive coefficient implementation. The resolution of the FT path gain should be chosen sufficiently fine to allow the adaptation process to track Filter tap adjustment as well as keep the Padé cells transfer functions, TF.

With reference to the embodiment shown in FIG. 3, versions of the analog circuit with parallel filter cells in a summing arrangement are described as follows. A summer, which could be a summing node, a summing amplifier (e.g., summing amplifier 206 of FIG. 2), a summer 106 (as shown in FIGS. 1 and 3), transimpedance amplifier, or multiple summers 106, sums outputs of filter taps that are implemented in parallel. There are filter taps from zero through n, where n is a finite integer greater than or equal to two. Each filter tap has the communication signal of interest, or a derivative thereof (e.g., amplified, or converted from voltage to current or current to voltage), as the input. The zeroth filter tap has a gain controlled amplifier 308 with gain controlled by a zeroth adaptive gain control coefficient, identified in this example as $alpha_0$. The zeroth filter tap is the only tap that lacks a low pass filter 306.

Each of the first through nth filter taps, one of which is shown with coefficient i, has a summer 106 with sums outputs of a unity gain amplifier 302 and output of a minus two gain low pass filter. The minus two gain low pass filter is implemented as an amplifier 304 with gain of negative two, e.g. an inverting amplifier with gain of two, in series with a low pass filter 306. Output of the summer 106 is fed into a gain controlled amplifier 310 with gain controlled by the ith adaptive gain control coefficient, identified in this example as alpha$_i$. Output of the gain controlled amplifier 310 is fed into the summer 106 that sums the outputs of the parallel-implemented filter taps. The pole of the low pass filter 306 is specific to the ith tap, and is identified as p$_i$. Further taps, up through n, are implemented similarly to the ith tap.

Amplifier gain, which mathematically represents multiplication, is a distributive property. Summing, which mathematically represents addition, is a commutative property. Embodiments of the analog circuit with parallel filter cells in a summing arrangement, from FIG. 3, can rearrange the locations of gain controlled amplifiers 308, 310, fixed gain amplifier 302, 304, and summers 106 to form electronic circuits with mathematically equivalent operations.

One such arrangement is shown in the embodiment of the parallel filter structure in FIG. 4. It is noted that each individual branch herein is no longer required to implement an all-pass function by itself, but rather a low-pass characteristic as the overall all-pass functionality is combined via the common feed-through path. Such implementations would be most favorable in cases as to maximize the achievable AAPC operating frequency. It should also be noted that the resulting set of coefficients pertaining to the structure in FIG. 4 would be different of that in FIG. 2 or FIG. 3, however functionally related. Versions of the analog circuit for the parallel filter structure of FIG. 4 are described as follows. A summer, which could be a summing node, a summing amplifier (e.g., summing amplifier 206 of FIG. 2), a summer 106 (as shown in FIGS. 1 and 3), transimpedance amplifier, or multiple summers 106, sums outputs of filter taps that are implemented in parallel. There are filter taps from zero through n, where n is a finite integer greater than or equal to two. Each filter tap has the communication signal of interest, or a derivative thereof (e.g., amplified, or converted from voltage to current or current to voltage), as the input. The zeroth filter tap has a gain controlled amplifier 308 with gain controlled by a zeroth adaptive gain control coefficient, identified in this example as alpha$_0$. The zeroth filter tap is the only tap that lacks a low pass filter 306.

Each of the first through nth filter taps, including one of which is shown with coefficient i and the last of which is shown with coefficient n, has a gain controlled amplifier 310 or 312 and a low pass filter 306 in series. For the ith tap, the gain controlled amplifier 310 has gain controlled by the ith adaptive gain control coefficient, identified in this example as alpha$_i$. Output of the gain controlled amplifier 310 is fed into low pass filter 306. The pole of the low pass filter 306 is specific to the ith tap, and is identified as p$_i$. Each low pass filter 306 implements a transfer function that has a pole equaling two times pi times a base frequency divided by a corresponding integer from one through n. In other words, for the transfer function in the ith tap low pass filter 306, the pole is at the base frequency divided by the integer i. Further taps, up through n, are implemented similarly to the ith tap. For example, see the nth tap, with gain controlled amplifier controlled by the nth adaptive gain control coefficient, and low pass filter with the nth pole at the base frequency divided by the integer n. In variations, the gain controlled amplifier 310 could be after the low pass filter 306, integrated with the low pass filter 306, or integrated with the summer 106 as a multiplying summer or gain controlled summer.

One example of the Adaptive Analog Parallel Combiner implementation especially suitable for maximizing operating frequencies is shown in FIG. 5. Each Filter tap is implemented based on a Gm stage with a given LP pole scaled by integer number with respect to a base frequency. Variable coefficients are implemented using controllable gm cells. To attain the overall FIG. 2 related APPS type transfer function a specialized algorithm is needed to compute the respective coefficients in the feed-through tap and the coefficients of other cell based taps.

With reference to the embodiment shown in FIG. 5, versions of the analog circuit with parallel filter Gm implementation are described as follows. Low pass filters 502 and gain controlled amplifiers 504 are implemented using fully differential transconductance amplifiers. Each gain controlled amplifier 504 applies an adaptive gain control coefficient to gm, the transconductance of the amplifier. A summer, which could be a summing node, a summing amplifier, a summer, transimpedance amplifier, or multiple summers, sums outputs of filter taps that are implemented in parallel. In the embodiment shown, gain controlled amplifiers 504 in fully differential form (i.e., differential input, differential output amplifiers) have outputs connected to a summing node 506 (e.g., two differential voltage nodes, each of which is a summing node for the respective negative or positive outputs of the fully differential amplifiers). There are filter taps from zero through n, where n is a finite integer greater than or equal to two. Each filter tap has the communication signal of interest, or a derivative thereof (e.g., amplified, or converted from voltage to current or current to voltage), as the input, in differential form. The zeroth filter tap has a gain controlled amplifier 504 with gain controlled by a zeroth adaptive gain control coefficient, identified in this example as alpha$_0$. The zeroth filter tap is the only tap that lacks a low pass filter 502.

Each of the first through nth filter taps, the last of which is shown with coefficient n, has a low pass filter 502 implemented with a fully differential transconductance amplifier, and a capacitor and a resistor in parallel across differential outputs of the transconductance amplifier. This is followed by the gain controlled amplifier 504 with gain controlled by the adaptive gain control efficient for that tap, e.g., alpha$_n$ for the nth tap. The pole of the low pass filter 502 is specific to each tap, and is implemented with the values of the capacitor and the resistor. For example, in the first tap, the first adaptive gain control coefficient alpha$_1$ controls the gain controlled amplifier 504, and the low pass filter pole is at the base frequency, represented by capacitor value C and resistor value R. In the second tap, the second adaptive gain control efficient alpha$_2$ controls the gain controlled amplifier 504, and the low pass filter pole is set at one half the base frequency, represented by capacitor value 2C and resistor value R. This is generalized to the nth tap, in which the nth adaptive gain control coefficient alpha$_n$ controls the gain controlled amplifier 504, and the low pass filter pole is set at 1/N of the base frequency, represented by capacitor value nC and resistor value R. The remaining taps from three through n−1, are implemented similarly to the nth tap.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An adaptive analog parallel combiner circuit for a communication signal, comprising:
   a summer, connected to sum, in parallel, outputs of N filter taps each having as input the communication signal, where N is a finite integer greater than or equal to two;
   a first filter tap without a filter;
   each remaining N filter taps having a low-pass filter with a resistor and capacitor specific to the filter tap setting a low-pass filter pole at $1/n$ of a base frequency, from $n=1$ through $n=N$; and
   the summer or the N filter taps having gain controlled, for each of the N filter taps, by an adaptive gain control coefficient specific to respective filter tap.

2. The adaptive analog parallel combiner circuit of claim 1, wherein the summer comprises a summing node, a summing amplifier, a transimpedance amplifier, a single summer or a plurality of summers.

3. The adaptive analog parallel combiner circuit of claim 1, wherein the summer or the N filter taps having gain controlled by the adaptive gain control coefficient comprises a plurality of gain controlled amplifiers each controlled by a corresponding adaptive gain control coefficient.

4. The adaptive analog parallel combiner circuit of claim 1, wherein the summer or the N filter taps having gain controlled by the adaptive gain control coefficient comprises a multiplying summer or gain controlled summer.

5. The adaptive analog parallel combiner circuit of claim 1, wherein the communication signal or a version thereof as input comprises an amplified communication signal, the communication signal converted from voltage to current, or the communication signal converted from current to voltage.

6. The adaptive analog parallel combiner circuit of claim 1, wherein the low-pass filter of each of the remaining N filters comprises a differential transconductance amplifier.

7. An adaptive analog parallel combiner circuit for receiver data recovery from a communication signal, comprising:
   a summer, connected to sum, in parallel, outputs of zeroth through Nth filter taps each having as input the communication signal or a version thereof, for N a finite integer greater than or equal to two, with gain controlled, for each of the zeroth through Nth filter taps, by an adaptive gain control coefficient specific to the filter tap;
   the zeroth filter tap having no filter; and
   each of first through Nth filter taps an nth filter tap having a low-pass filter with a resistor value R and capacitor value nC specific to the filter tap and setting a low-pass filter pole at $1/n$ of a base frequency, from $n=1$ through $n=N$.

8. The adaptive analog parallel combiner circuit of claim 7, wherein the summer comprises a summing node, a summing amplifier, a transimpedance amplifier, a single summer or a plurality of summers, having as input the outputs of the zeroth through Nth filter taps.

9. The adaptive analog parallel combiner circuit of claim 7, wherein the summer or the zeroth through Nth filter taps having gain controlled by the adaptive gain control coefficient comprises a plurality of gain controlled amplifiers each in one of the zeroth through Nth filter taps and controlled by a corresponding adaptive gain control coefficient, with the gain controlled amplifier of each of the first through Nth filter taps preceding the low-pass filter.

10. The adaptive analog parallel combiner circuit of claim 7, wherein the summer or the zeroth through Nth filter taps having gain controlled by the adaptive gain control coefficient comprises a plurality of gain controlled amplifiers each in one of the zeroth through Nth filter taps and controlled by a corresponding adaptive gain control coefficient, with the gain controlled amplifier of each of the first through Nth filter taps after the low-pass filter.

11. The adaptive analog parallel combiner circuit of claim 7, wherein the summer or zeroth through Nth filter taps having gain controlled by the adaptive gain control coefficient comprises a gain controlled amplifier integrated with the summer as a multiplying summer or gain controlled summer.

12. The adaptive analog parallel combiner circuit of claim 7, wherein:
the communication signal or the version thereof as input comprises a differential input signal;
the summer comprises a differential amplifier; and
the low-pass filter in each of the first through Nth filter taps comprises a differential amplifier.

13. The adaptive analog parallel combiner circuit of claim 7, wherein the low-pass filter of each of the first through Nth filters comprises a differential transconductance amplifier having the resistor of value R and the capacitor of value nC across differential outputs of the differential transconductance amplifier.

14. A method for receiver data recovery from a communication signal, performed by an adaptive analog parallel combiner circuit, the method comprising:
low-pass filtering in each of first through Nth filter taps in parallel, the communication signal, the first through Nth filter taps each having a low-pass filter with a resistor value R and capacitor value nC specific to the filter tap and setting a low-pass filter pole at 1/n of a base frequency, from n=1 through n=N, with R and C same for all of the first through Nth filter taps, where N is a finite integer greater than or equal to two;

summing outputs of a zeroth filter tap of the communication signal or a version thereof, having no filter, and the first through Nth filter taps, in parallel; and
controlling gain, for each of the zeroth through Nth filter taps, by an adaptive gain control coefficient specific to each filter tap.

15. The method of claim 14, wherein the summing comprises summing the outputs of the zeroth through Nth filter taps by a summing node, a summing amplifier, a transimpedance amplifier, a single summer or a plurality of summers.

16. The method of claim 14, wherein the controlling the gain for each of the zeroth through Nth filter taps comprises controlling gain of a gain controlled amplifier in the zeroth filter tap and controlling gain of a gain controlled amplifier preceding the low-pass filter in each of the first through Nth filter taps.

17. The method of claim 14, wherein the controlling the gain for each of the zeroth through Nth filter taps comprises controlling gain of a gain controlled amplifier in the zeroth filter tap and controlling gain of a gain controlled amplifier following the low-pass filter in each of the first through Nth filter taps.

18. The method of claim 14, wherein the controlling the gain for each of the zeroth through Nth filter taps comprises controlling gain through a multiplying summer or gain controlled summer.

19. The method of claim 14, further comprising:
receiving the communication signal or the version thereof as a differential input signal, wherein the summing comprises summing differential outputs of the zeroth through Nth filter taps and wherein the low-pass filtering comprises low-pass filtering differential signals.

20. The method of claim 14, wherein the low-pass filtering comprises low-pass filtering the communication signal or the version thereof through a low-pass filter of each of the first through Nth filters comprising a differential transconductance amplifier having the resistor of value R and the capacitor of value nC across differential outputs of the differential transconductance amplifier.

* * * * *